(12) United States Patent
Flachowsky et al.

(10) Patent No.: US 8,598,007 B1
(45) Date of Patent: Dec. 3, 2013

(54) METHODS OF PERFORMING HIGHLY TILTED HALO IMPLANTATION PROCESSES ON SEMICONDUCTOR DEVICES

(75) Inventors: Stefan Flachowsky, Dresden (DE); Jan Hoentschel, Dresden (DE); Thilo Scheiper, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/487,351

(22) Filed: Jun. 4, 2012

(51) Int. Cl.
*H01L 21/336* (2006.01)

(52) U.S. Cl.
USPC ........... 438/303; 438/302; 438/275; 438/525; 438/373

(58) Field of Classification Search
CPC .................................................. H01L 21/26586
USPC .................. 438/302, 275, 303, 525, 217, 373
See application file for complete search history.

(56) References Cited

U.S. PATENT DOCUMENTS

| 7,598,161 | B2 | 10/2009 | Zhou et al. |
| 2004/0063262 | A1* | 4/2004 | Feudel et al. ................. 438/197 |
| 2005/0074972 | A1* | 4/2005 | Saito .............................. 438/689 |
| 2008/0105910 | A1* | 5/2008 | Matsuki ........................ 257/295 |
| 2009/0081860 | A1* | 3/2009 | Zhou et al. .................... 438/531 |
| 2010/0047985 | A1* | 2/2010 | Dakshina Murthy et al. 438/303 |
| 2011/0042728 | A1* | 2/2011 | Cheng et al. .................. 257/288 |

* cited by examiner

*Primary Examiner* — Kyoung Lee
*Assistant Examiner* — Ratisha Mehta
(74) *Attorney, Agent, or Firm* — Williams, Morgan & Amerson, P.C.

(57) ABSTRACT

One illustrative method disclosed herein involves forming first and second gate structures that include a cap layer for a first transistor device and a second transistor device, respectively, wherein the first and second transistors are oriented transverse to one another, performing a first halo ion implant process to form first halo implant regions for the first transistor with the cap layer in position in the first gate structure of the first transistor, removing the cap layer from at least the second gate structure of the second transistor and, after removing the cap layer, performing a second halo ion implant process to form second halo implant regions for the second transistor, wherein the first and second halo implant processes are performed at transverse angles relative to the substrate.

23 Claims, 14 Drawing Sheets

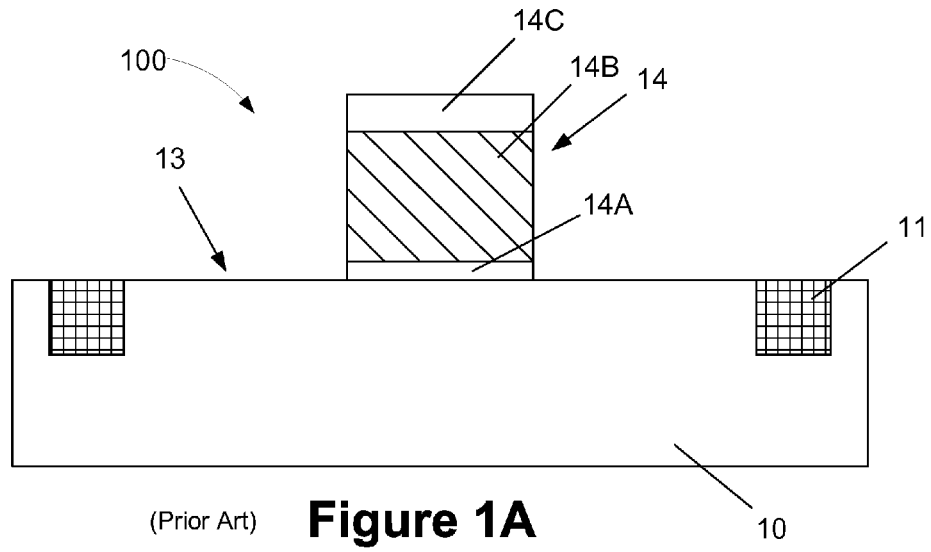
(Prior Art) Figure 1A
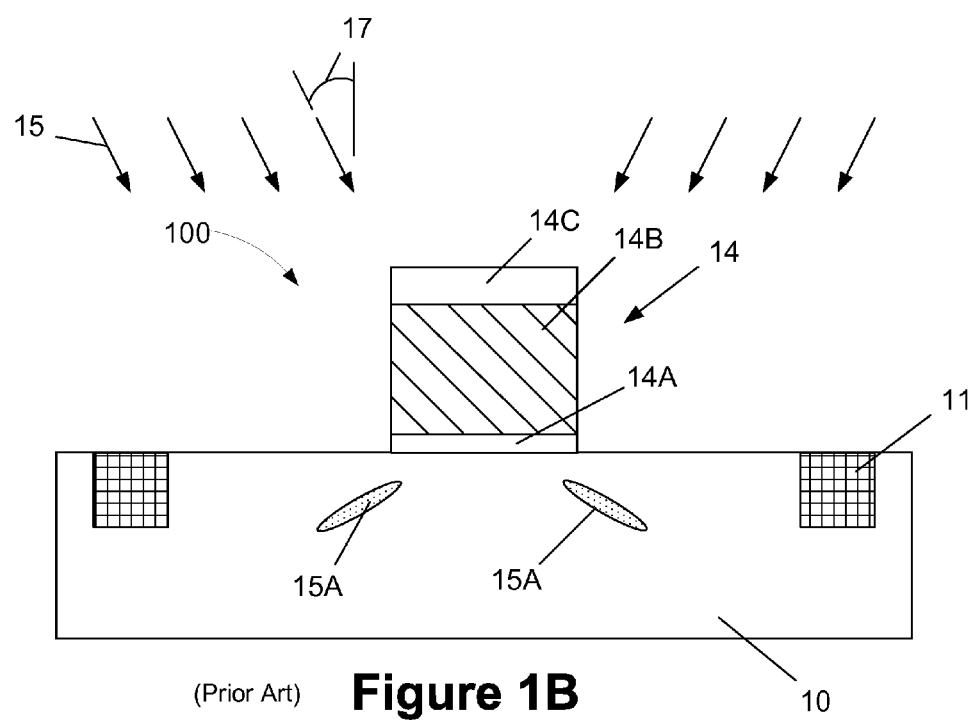
(Prior Art) Figure 1B

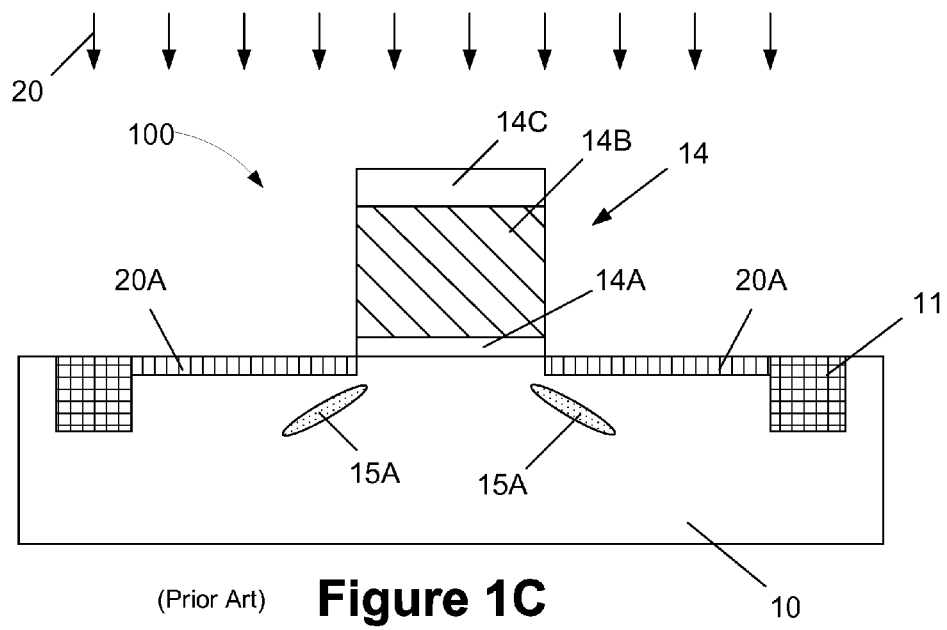
(Prior Art) Figure 1C
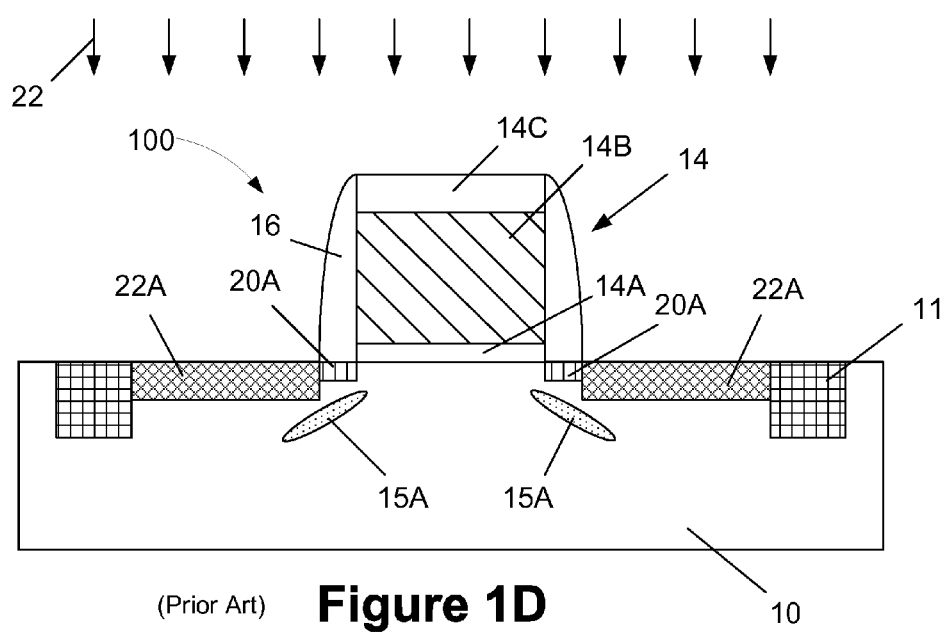
(Prior Art) Figure 1D

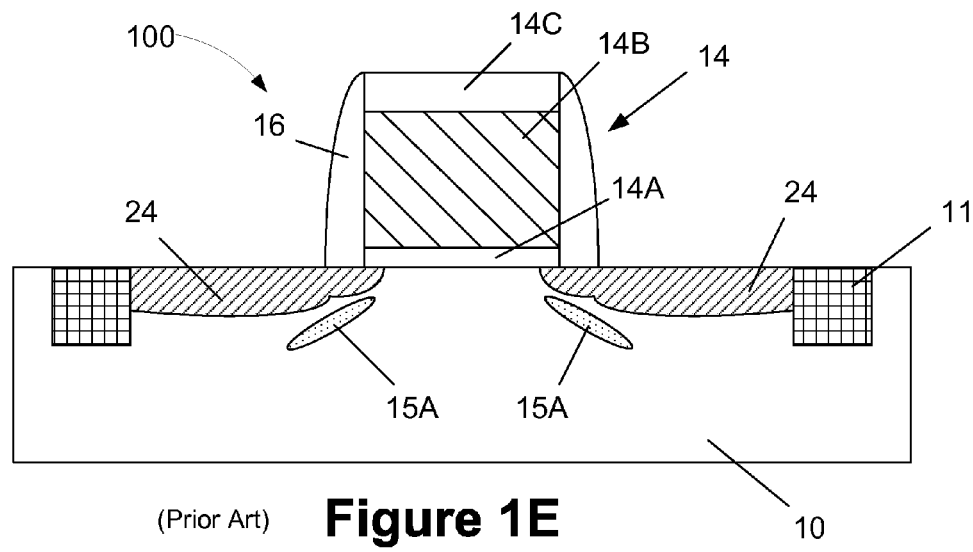
(Prior Art) Figure 1E
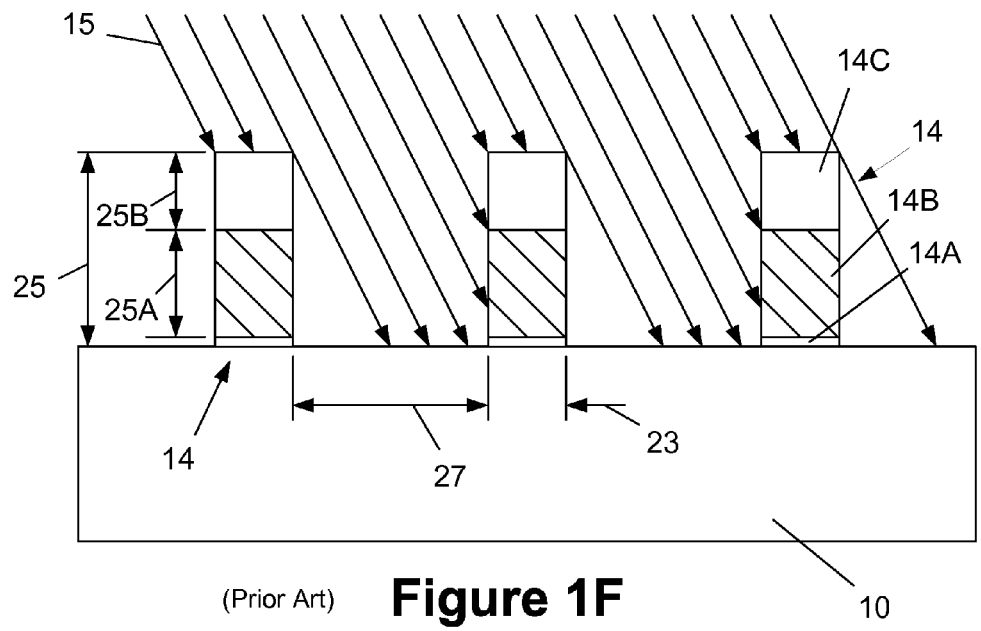
(Prior Art) Figure 1F

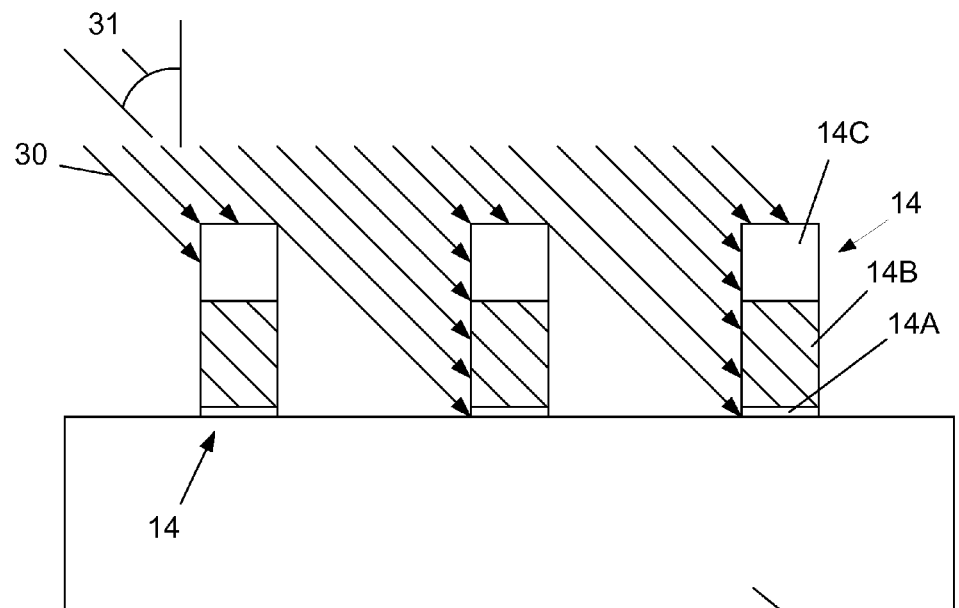
(Prior Art) Figure 1G
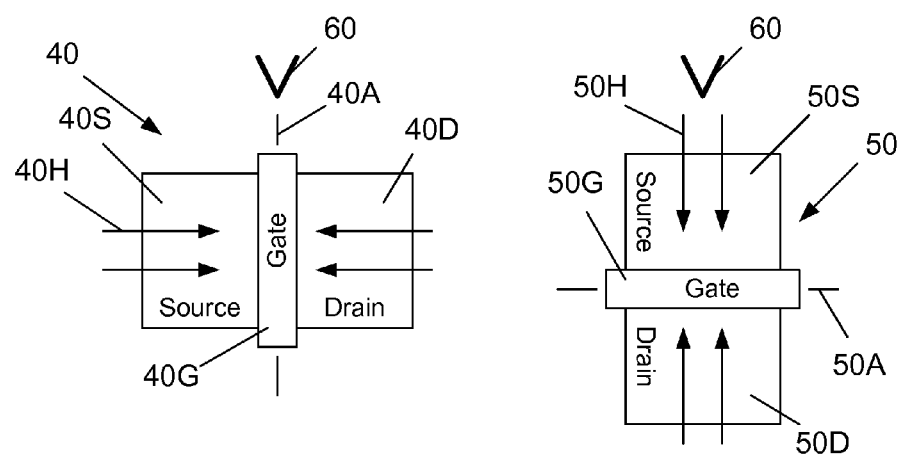
(Prior Art) Figure 2

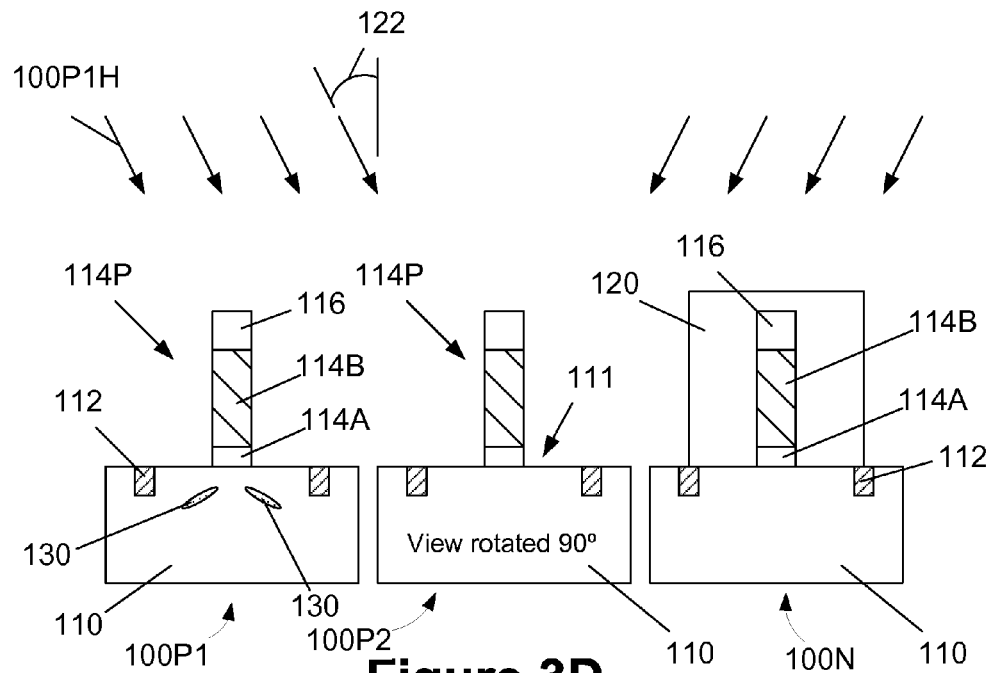
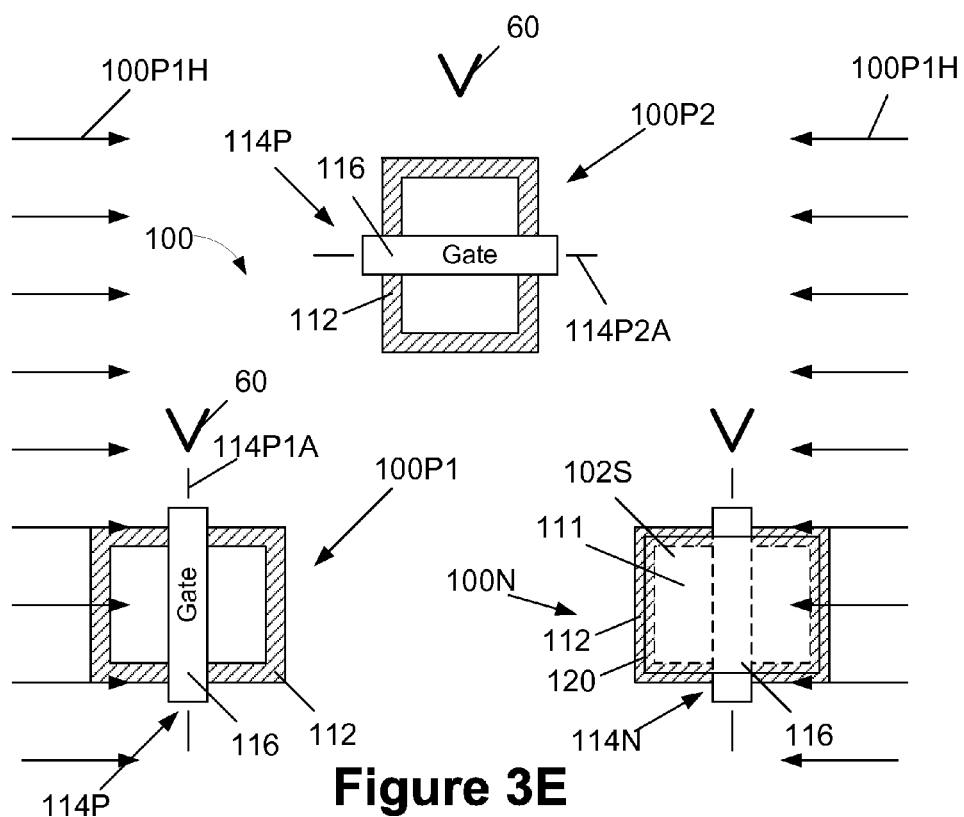

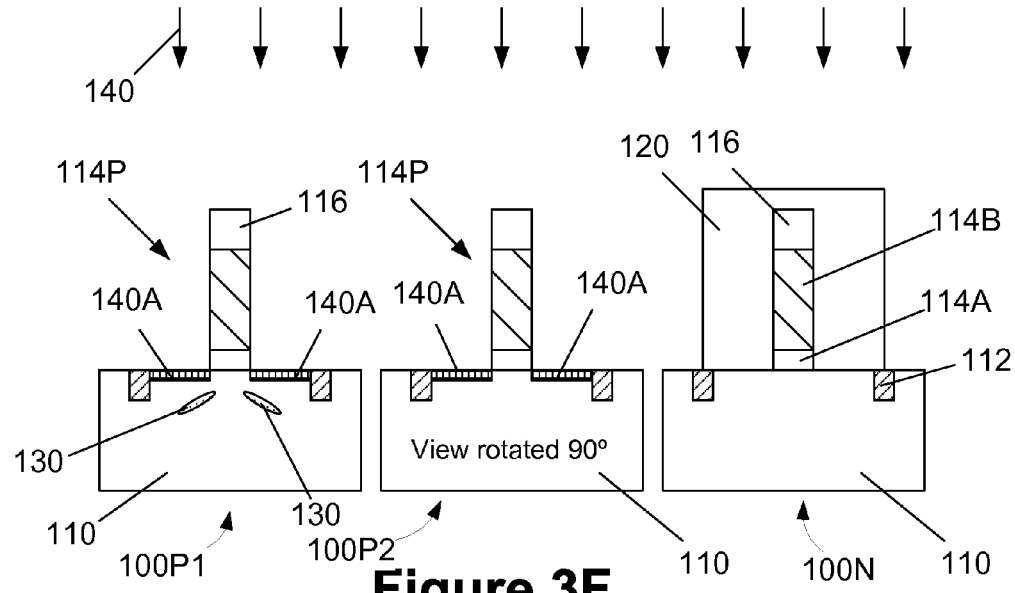
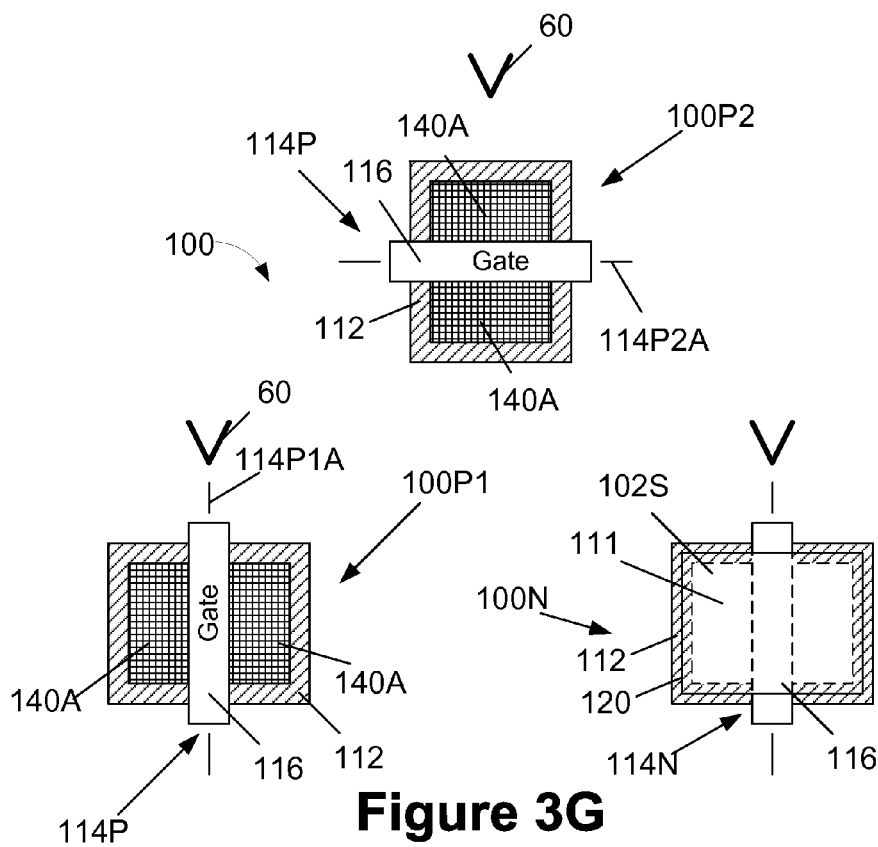
Figure 3F
Figure 3G

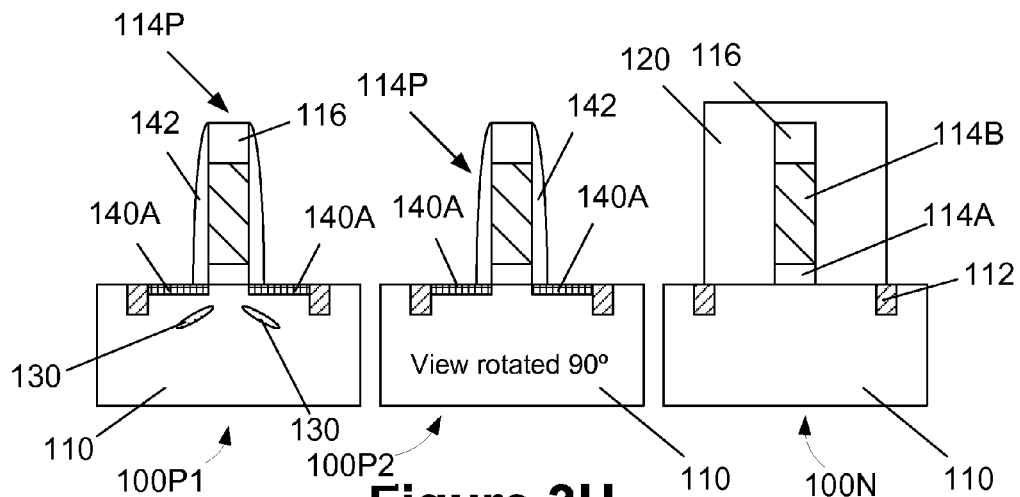
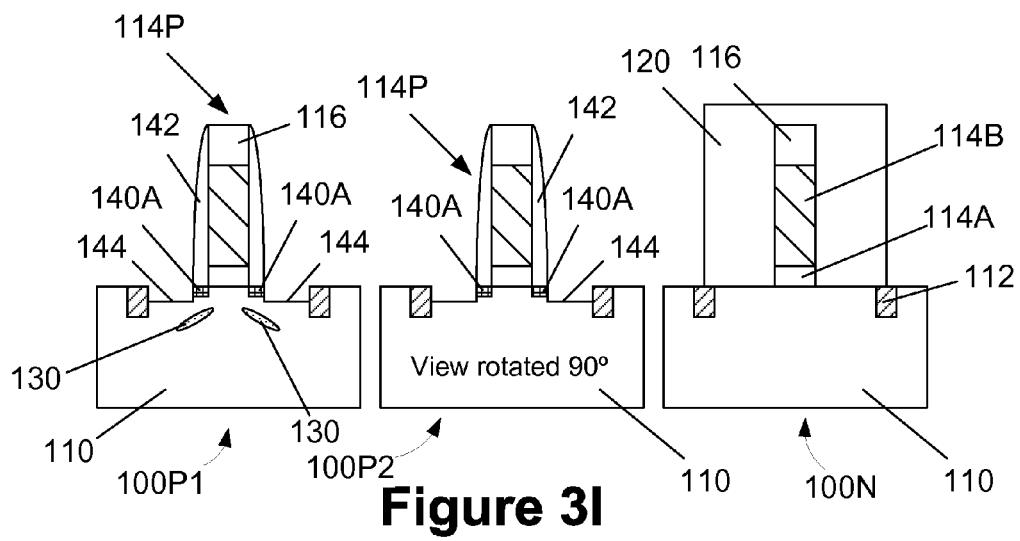
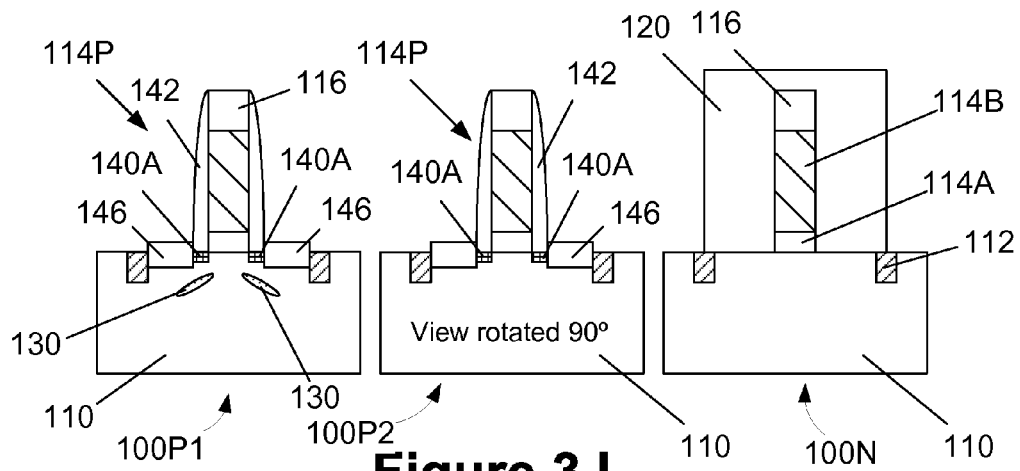

METHODS OF PERFORMING HIGHLY TILTED HALO IMPLANTATION PROCESSES ON SEMICONDUCTOR DEVICES

BACKGROUND OF THE INVENTION

1. Field of the Invention

Generally, the present disclosure relates to the manufacture of sophisticated semiconductor devices, and, more specifically, to various methods of performing highly tilted halo implantation processes on semiconductor devices such as transistors.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (FETs) represent one important type of circuit element that substantially determines performance of the integrated circuits. Field effect transistors are typically either NFET devices or PFET devices. During the fabrication of complex integrated circuits, millions of transistors, e.g., NFET transistors and/or PFET transistors, are formed on a substrate including a crystalline semiconductor layer. A field effect transistor, irrespective of whether an NFET transistor or a PFET transistor is considered, typically comprises so-called PN junctions that are formed by an interface of highly doped regions, referred to as drain and source regions, with a slightly doped or non-doped region, referred to as a channel region, disposed between the highly doped source/drain regions. The channel length of a MOS transistor is generally considered to be the lateral distance between the source/drain regions.

Ion implantation is a technique that is employed in many technical fields to implant dopant ions into a substrate so as to alter the characteristics of the substrate or of a specified portion thereof. The rapid development of advanced devices in the semiconductor industry is based on, among other things, the ability to generate highly complex dopant profiles within tiny regions of a semiconducting substrate by performing advanced implantation techniques through a masking layer. In the case of an illustrative transistor, ion implantation may be used to form various doped regions, such as halo implant regions, extension implant regions and deep source/drain implant regions, etc.

An illustrative ion implantation sequence for forming various implant regions for an illustrative prior art transistor 100 will now be discussed with reference to FIGS. 1A-1E. FIG. 1A depicts the transistor 100 at an early stage of fabrication, wherein a gate structure 14 has been formed above an illustrative bulk silicon substrate 10. An active region 13 is defined in the substrate 10 by a shallow trench isolation structure 11. The gate structure 14 typically includes a gate insulation layer 14A, e.g., silicon dioxide, a conductive gate electrode 14B, e.g., polysilicon, and a gate cap layer 14C, e.g., silicon nitride. The gate structure 14 may be formed by forming layers of material that correspond to the gate insulation layer, the gate electrode and the gate cap layer and thereafter patterning those layers of material using known etching and photolithography techniques.

The masking layers that would be used during the implantation sequence shown in FIGS. 1A-1E are not depicted in the drawings. As shown in FIG. 1B, an angled ion implantation process 15 is performed to form so-called halo implant regions 15A in the substrate 10. The purpose of the halo implant regions 15A is to reinforce the doping of the substrate. For an NFET device, the halo implant regions 15A are comprised of a P-type dopant material, whereas, for a PFET device, the halo implant regions 15A are comprised of an N-type dopant material. The ion implant process 15 is performed at an angle 17 (relative to the vertical) which may vary between about 20-30 degrees.

Next, as shown in FIG. 1C, an ion implantation process 20 is typically performed to form so-called extension implant regions 20A in the substrate 10. Typically, the extension implant regions 20A will be self-aligned with respect to the sidewall of the gate structure 14 (for NFET devices) or there may be an offset spacer or liner (not shown) formed on the sidewall of the gate structure 14 prior to performing the extension implant process 20 (for a PFET device). For an NFET device, the extension implant regions 20A are comprised of an N-type dopant material, whereas, for a PFET device, the extension implant regions 20A are comprised of a P-type dopant material.

Then, as shown in FIG. 1D, sidewall spacers 16 are formed proximate the gate structure 14. The sidewall spacers 16 are typically formed by conformably depositing a layer of spacer material and thereafter performing an anisotropic etching process. With continuing reference to FIG. 1D, an ion implantation process 22 is performed on the transistor 100 to form so-called deep source/drain implant regions 22A in the substrate 10. The ion implantation process 22 performed to form the deep source/drain implant regions 22A is typically performed using a higher dopant dose and a higher implant energy than the ion implantation process 20 that is performed to form the extension implant regions 20A. For an NFET device, the source/drain implant regions 22A are comprised of an N-type dopant material, whereas, for a PFET device, the source/drain implant regions 22A are comprised of a P-type dopant material.

Thereafter, as shown in FIG. 1E, a heating or anneal process is performed to form the final source/drain regions 24 for the transistor 100. This heating process repairs the damage to the lattice structure of the substrate material as a result of the implantation processes and it activates the implanted dopant materials, i.e., the implanted dopant materials are incorporated into the silicon lattice. The various implantation processes described above may be performed using well-known ion implantation systems. Of course, the implant sequence described above may be varied. For example, the halo implant regions 15A may be formed after the extension implant regions 20A if desired.

FIGS. 1F and 1G will be referenced to describe various limitations as it relates to the formation of halo implant regions for semiconductor devices, such as transistors. As depicted therein, a plurality of gate structures 14 are formed above a substrate 10. In modern semiconductor devices, the gate structures 14 are very small and have a very small distance or pitch between adjacent gate structures 14. For example, in one illustrative embodiment, the gate structures 14 may have an overall height 25 of about 100-110 nm, a width (or critical dimension) 23 of about 30-40 nm, and they may have a spacing 27 between them of about 120 nm or so. The gate electrode 14B may have a height 25A of about 50-60 nm and the gate cap layer 14C may have a thickness 25B of about 40-50 nm.

FIG. 1F depicts the situation where a halo implant process is performed on the devices at a relatively low implant angle (relative to the vertical), e.g., about 20-30 degrees, like the illustrative angled implant process 15 described above and depicted in FIG. 1F. At relatively low implant angles, there is sufficient room between adjacent gate structures 14 such that a sufficient number of ions are not blocked by the gate structures 14 and ions may be implanted to form the halo implant regions discussed above. FIG. 1G depicts a situation where a relatively high-angled halo implant process 30, e.g., a process performed at an implant angle 31 of about 35-50 degrees or more (relative to the vertical). In such a highly angled implant process 30, the gate structures 14 effectively block the ions from being implanted into the substrate 10. Accordingly, such highly tilted halo implant processes may not be used even though the use of such highly angled halo implantation processes may be desirable or needed.

FIG. 2 depicts another situation where the formation of halo implant regions involves rotation of the wafer. In many product designs, the long axis of the gate electrodes of the various transistors are all parallel to one another—these may be generically referred to as "standard" or "vertical" transistors. Frequently, the long axis of the gate electrodes of such standard transistors is positioned parallel to a notch in a semiconducting substrate, wherein the notch indicates a particular crystallographic orientation. However, in other product applications, the product may contain both standard transistors and so-called "horizontal" transistors, wherein the long axis of the horizontal transistor is positioned at an angle of about 90 degrees relative to the long axis of the standard transistors. Various input/output devices are one example where such horizontal transistors may be found. FIG. 2 depicts an illustrative standard transistor 40 and a horizontal transistor 50. The standard transistor 40 comprises a gate electrode 40G, a source region 40S and a drain region 40D. The horizontal transistor 50 comprises a gate electrode 50G, a source region 50S and a drain region 50D.

The long axis 40A of the standard transistor 40 is positioned approximately parallel to the schematically depicted wafer notch 60. The long axis 50A of the horizontal transistor 50 is oriented at approximately 90 degrees relative to the long axis 40A of the standard transistor 40. The transistors 40, 50 may both be PFET devices or they may both be NFET devices.

As shown in FIG. 2, a tilted halo implant process 40H is performed to form halo implant regions (not shown) in the transistor 40. However, since the transistor 50 is rotated about 90 degrees, the halo implant process 40H does not form the desired halo implant regions on the transistor 50. That is, the halo implant process 40H is performed in a direction that corresponds to the gate width of the transistor 50. To form the halo implant regions (not shown) for the transistor 50, the substrate is rotated about 90 degrees, and a second halo implant process 50H is performed. The implant step 50H is sometimes referred to as a "twist" implant process due to the need to rotate the substrate. The halo implantation process 50H does not form halo implant regions in the transistor 40 due to the position of the transistor 40 during the halo implantation process 50H. That is, the halo implant process 50H is performed in a direction that corresponds to the gate width of the transistor 40. The implant processes 40H, 50H are typically performed at a relatively small implant angle (relative to the vertical) of about 30 degrees.

Such a two-step halo implantation process to form halo implant regions where the transistors are oriented at an angle of about 90 degrees relative to one another limits what can be done to improve device performance. For example, the implantation parameters for the second halo implant process 50H may need to be varied as compared to such parameters used during the first halo implant process 40H so as to change various performance characteristics of the transistor 50, e.g., the implantation dose during the second halo implant process 50H may need to be increased to increase the threshold voltage of the transistor 50 and to reduce its drive current until such time as the transistor 50 meets pre-established performance criteria. However, increasing the dopant dose employed during the halo implant process 50H may adversely affect the performance characteristics of other devices formed above the substrate that are exposed to the halo implant process 50H. For example, an increase in the dopant dose employed in the halo implant process 50H may, undesirably, increase the capacitance of, for example, a large area diode (not shown). The inventors have discovered that desirable changes to drive current of the transistor 50 may be accomplished by performing the halo implant process 50H at a higher implant angle without adversely affecting the capacitance of the illustrative large area diode. Unfortunately, as noted above with respect to FIGS. 1F-1G, due to the size of the gate structures and the limited spacing between adjacent gate structures, the shadowing effect of the gate structures 14 effectively prevents the use of highly-tilted halo implant processes in many modern semiconductor devices.

Many integrated circuit products require the formation of PFET and NFET devices on a common substrate. As is well known to those skilled in the art, manufacturing each of the devices involves the use of techniques that may be common to both types of devices and some techniques that are unique to each type of device. In the end, a process flow must be established that permits the most effective and efficient manufacturing of such devices as possible, typically in as few process steps as possible. For example, in a situation that involves both standard and horizontally oriented PFET transistors and standard NFET transistors, an illustrative process flow may include the following: Initially, isolation structures, such as trench isolation structures are formed in a substrate to define active regions for the various devices. Thereafter, the NFET device regions are masked and a first tilted halo implant process is performed for the standard PFET transistor. Thereafter, a vertically oriented extension implant processes is performed to form extension implant regions for both the standard and horizontal PFET transistors. Next, the substrate is rotated about 90 degrees and a second tilted halo implant process is performed to form halo implant regions in the horizontal PFET transistor. Of course, the first angled halo implant process could have been performed on the horizontal PFET transistor if desired. The halo implantation processes performed on the PFET transistors may be performed at an angle of about 30 degrees (relative to the vertical). After this implant sequence, embedded silicon/germanium (SiGe) source/drain regions are form for both the standard and horizontal PFET transistors using etching and epitaxial deposition processes known to those skilled in the art. The SiGe source/drain regions are typically doped in situ, although dopants may be introduced into the SiGe source/drain regions via ion implantation if desired. Thereafter, the masking layer used to mask the NFET device regions is removed and the gate cap layers, like the gate cap layer 14C depicted in FIG. 1A, are removed from the gate structures of all of the PFET and NFET devices. Next, the PFET device regions are masked and a tilted halo implant process is performed to form halo implant regions for the standard NFET devices. The halo implantation processes performed on the NFET transistors may be performed at a greater angle than the halo implantation processes performed on the PFET transistors, e.g., the halo implantation processes performed on the NFET transistors may be performed at an angle of about 35 degrees (relative to the vertical). Thereafter, a plurality of vertical ion implantation processes are performed to form extension implant regions and source/drain implant regions in the exposed NFET devices. An anneal process is then performed to activate the implanted dopant materials and to repair damage to the substrate due to the various ion implantation processes disclosed above. After the anneal process, conductive contacts are formed to the transistor devices using known techniques and so-called back-end-of-the-line (BEOL) processing is performed. Of course, as will be recognized by those skilled in the art, the above process flow does not describe each and every detailed step in the fabrication of such a semiconductor device, but it does set forth at least one illustrative process flow that has been employed as it relates to the formation of halo implant regions on integrated circuit products that include both standard and horizontal transistors.

The present disclosure is directed to various methods of performing highly tilted halo implantation processes on semiconductor devices, such as transistors, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of performing highly tilted halo implantation processes on semiconductor devices such as transistors. One illustrative method disclosed herein involves forming first and second gate structures that include a cap layer for a first transistor device and a second transistor device, respectively, wherein the first and second transistors are oriented transverse to one another, performing a first halo ion implant process to form first halo implant regions for the first transistor with the cap layer in position in the first gate structure of the first transistor, removing the cap layer from at least the second gate structure of the second transistor and, after removing the cap layer, performing a second halo ion implant process to form second halo implant regions for the second transistor, wherein the first and second halo implant processes are performed at transverse angles relative to the substrate.

Another illustrative method disclosed herein involves forming first, second and third gate structures, a first PFET transistor, a second PFET transistor device and an NFET transistor, wherein each of the gate structures includes a cap layer and wherein the first and second PFET transistors are oriented transverse to one another, performing a first halo ion implant process at a first tilt angle to form first halo implant regions for the first PFET transistor with the cap layer in position in the first gate structure, removing the cap layer from the first, second and third gate structures, forming halo implant regions, extension implant regions and source/drain implant regions for the NFET transistor, and, after forming the doped regions for the NFET transistor, performing a second halo ion implant process at a second tilt angle to form second halo implant regions for the second PFET transistor, wherein the first and second halo implant processes are performed at transverse angles relative to the substrate, and wherein the second tilt angle is greater than the first tilt angle.

BRIEF DESCRIPTION OF THE DRAWINGS

The disclosure may be understood by reference to the following description taken in conjunction with the accompanying drawings, in which like reference numerals identify like elements, and in which:

FIGS. 1A-1G depict one illustrative process flow for forming halo implant regions and source/drain regions on a prior art transistor device and describe problems associated with shadowing of highly tilted ion implantation processes;

FIG. 2 depicts one illustrative example of prior art transistors that are oriented transverse to one another.

Figure 3A:
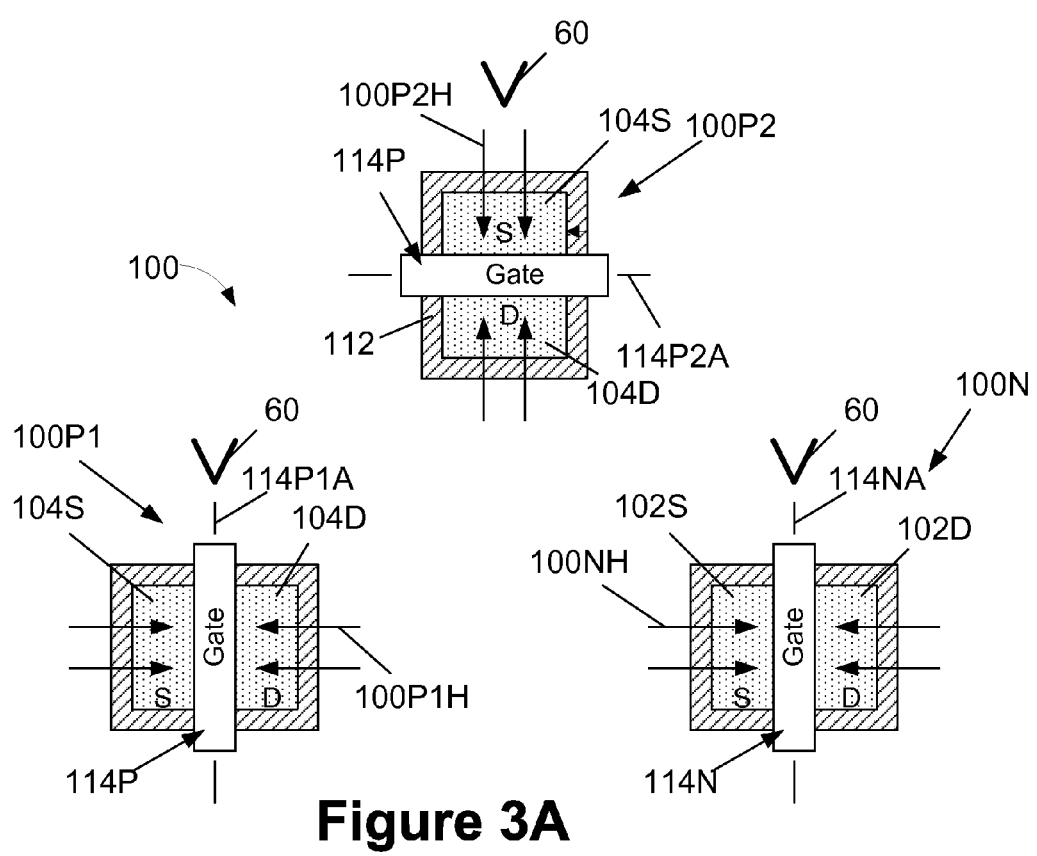
FIGS. 3A-3S depict various illustrative methods directed to various methods of performing highly tilted halo implantation processes on semiconductor devices such as transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of performing highly tilted halo implantation processes on semiconductor devices such as transistors. As will be readily apparent to those skilled in the art upon a complete reading of the present application, the present method is applicable to a variety of devices and technologies, e.g., NFET, PFET, CMOS, etc., and is readily applicable to a variety of integrated circuit products, including, but not limited to, ASIC's, logic devices, memory devices, etc. With reference to the attached drawings, various illustrative embodiments of the methods disclosed herein will now be described in more detail.

Figure 3B:
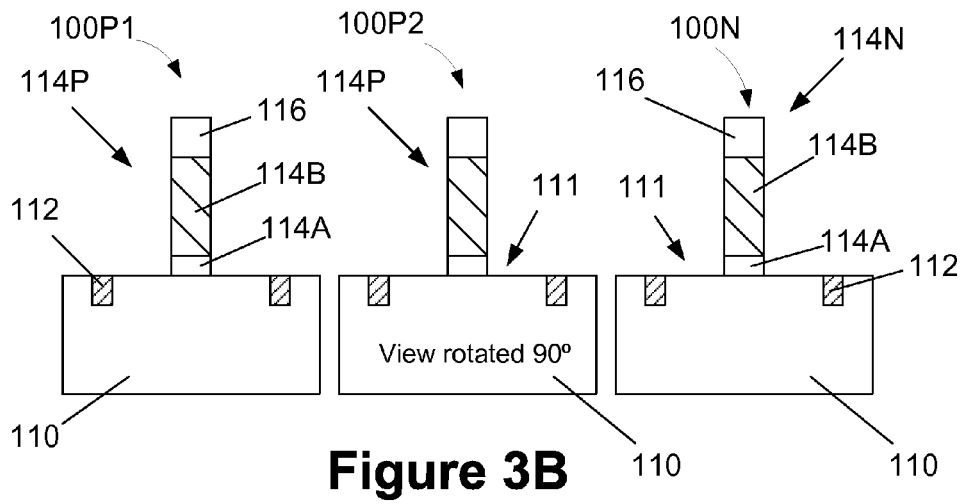
Figure 3C:
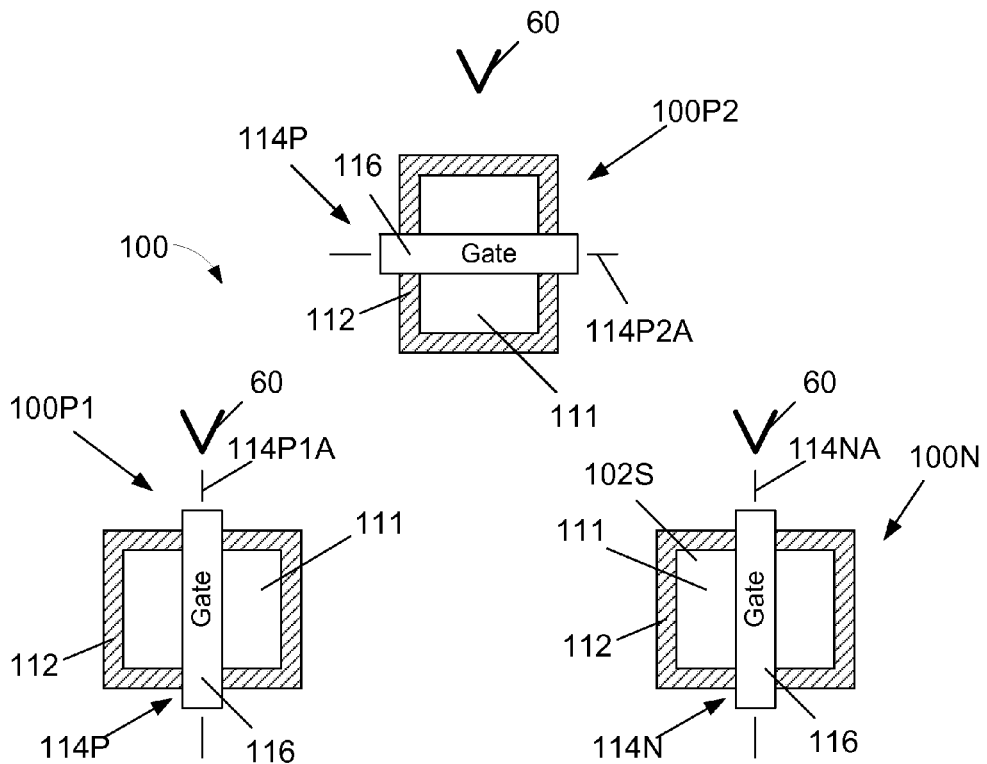
Figure 3K:
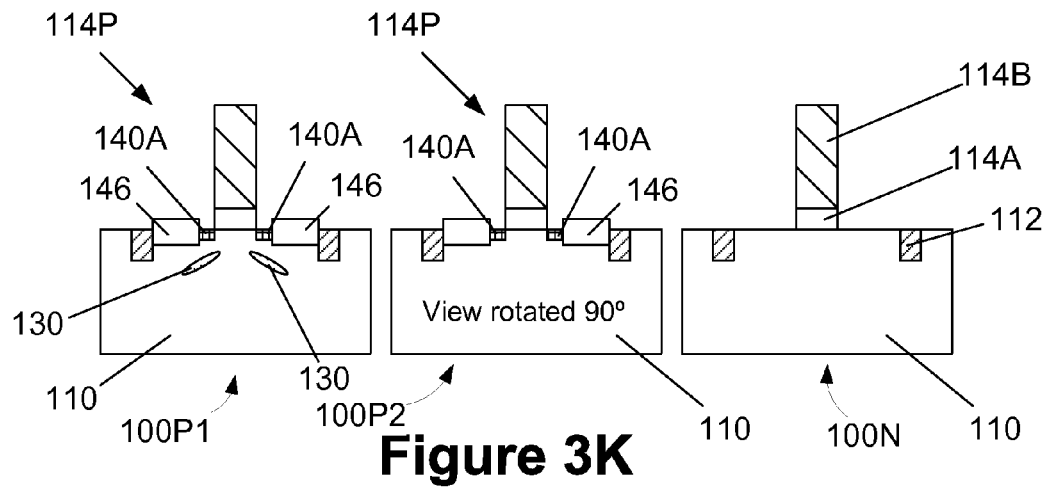
Figure 3L:
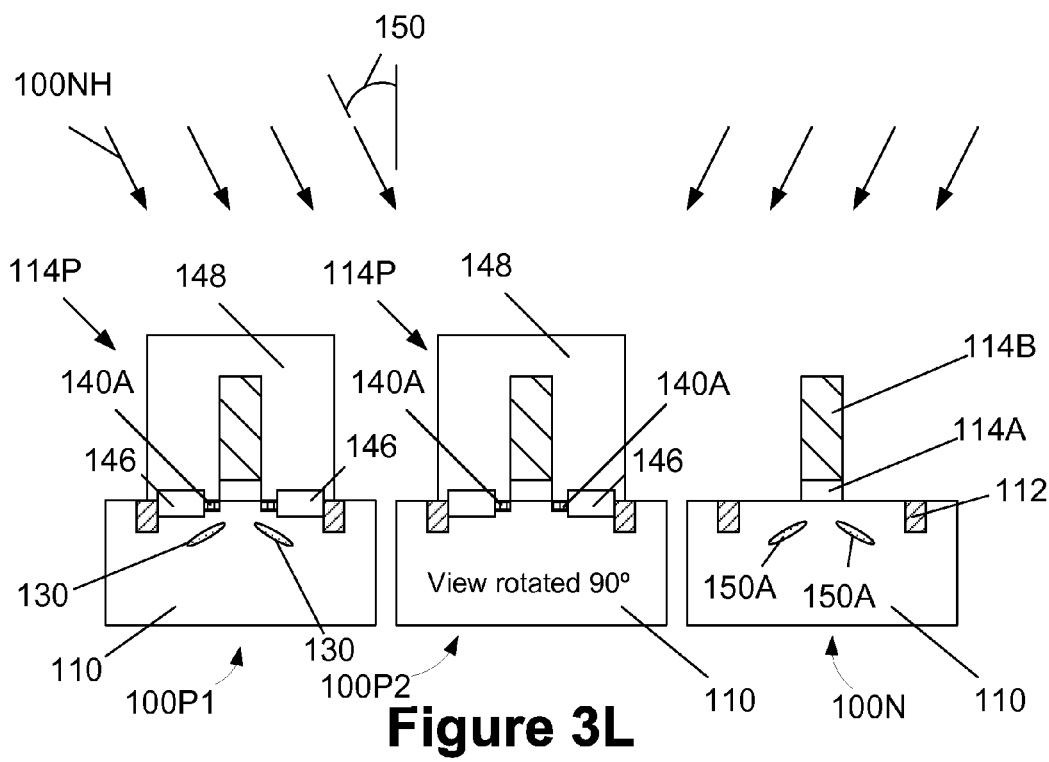
Figure 3M:
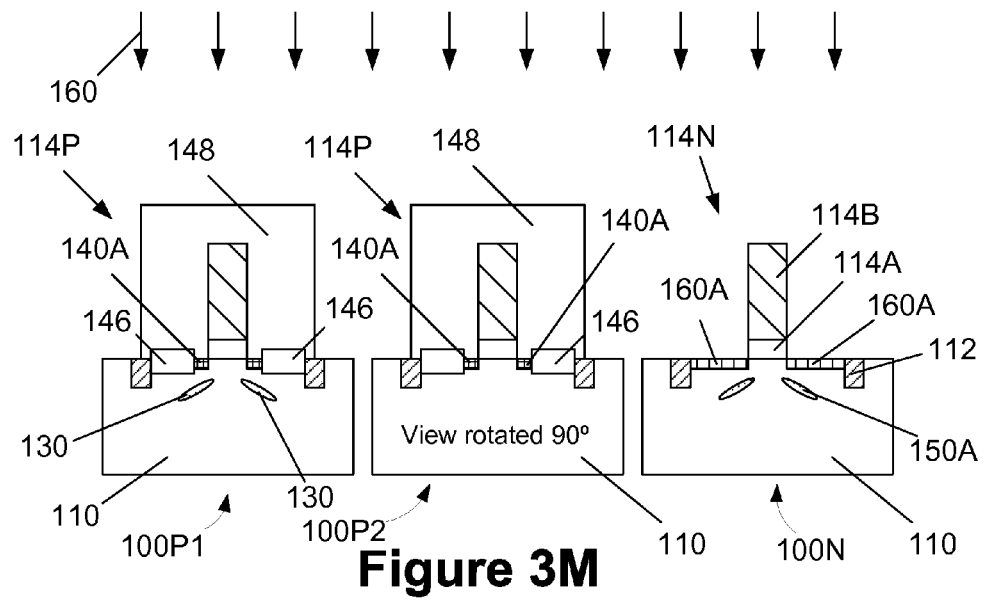
Figure 3N:
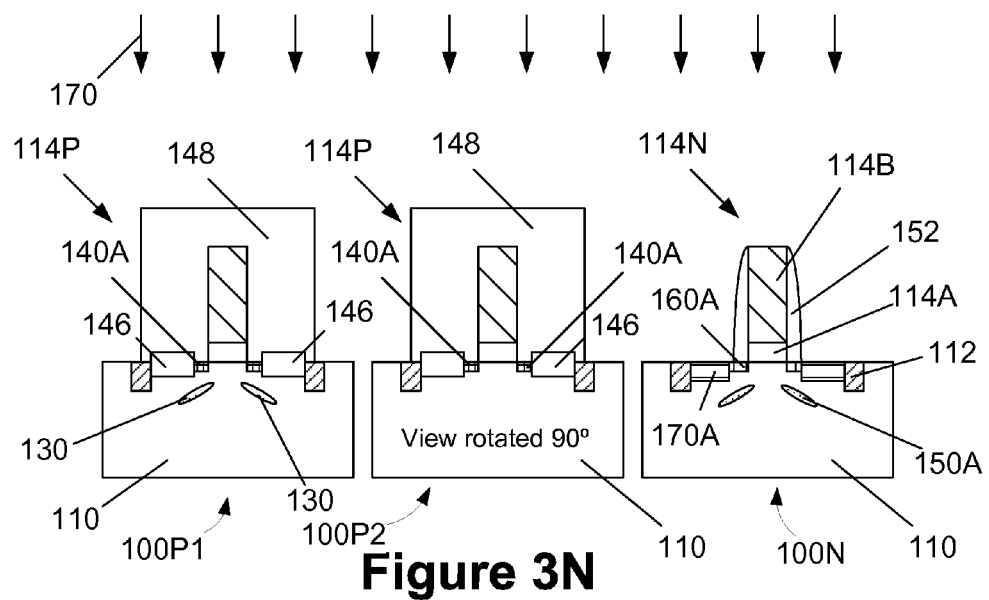
Figure 3O:
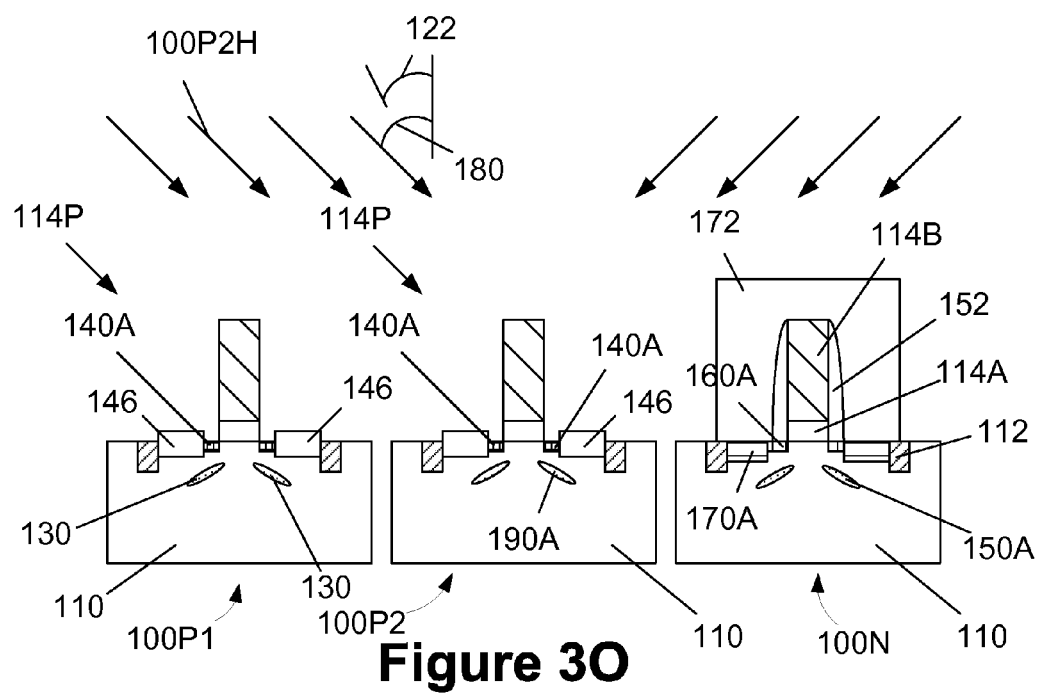
Figure 3P:
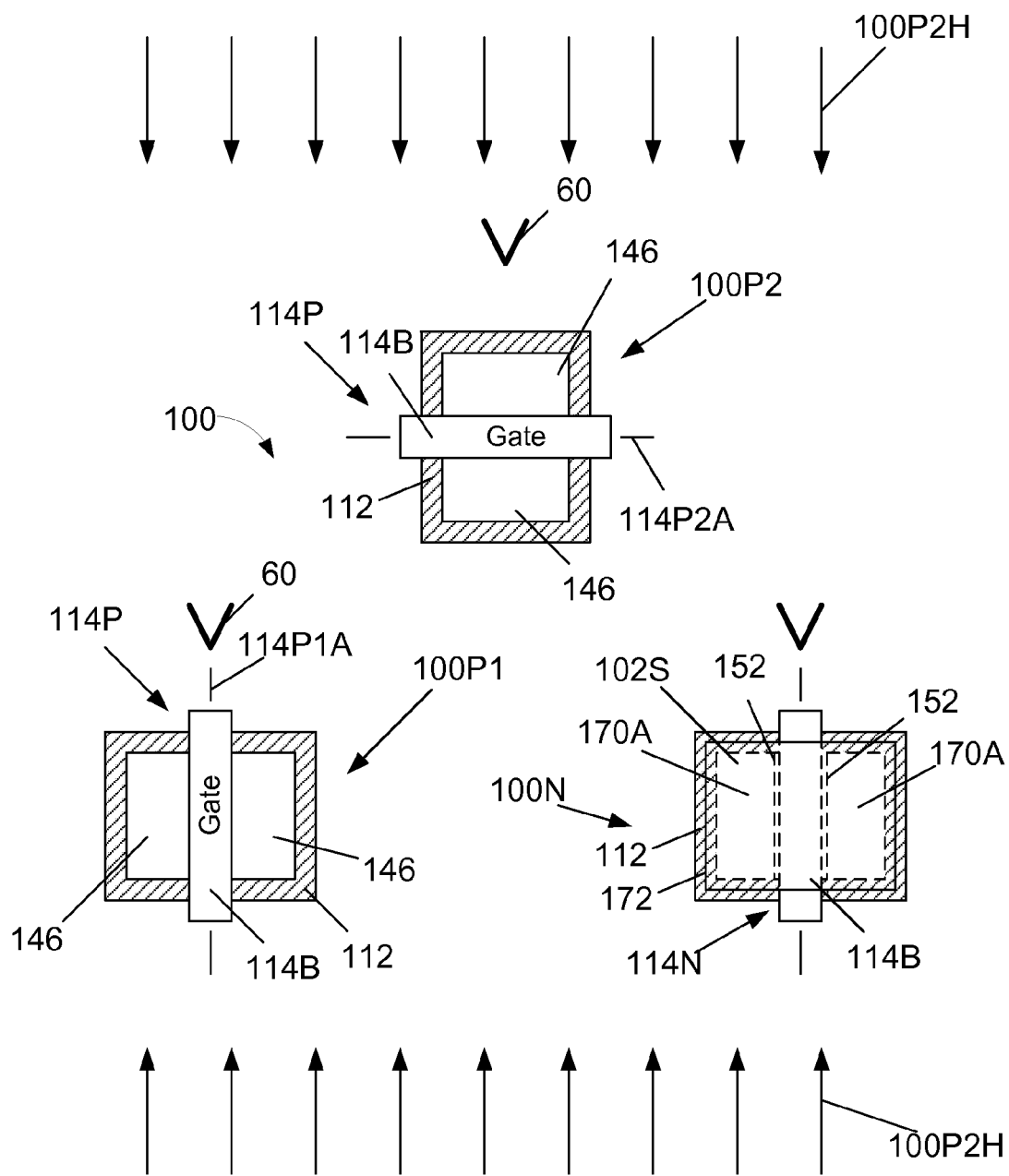
Figure 3Q:
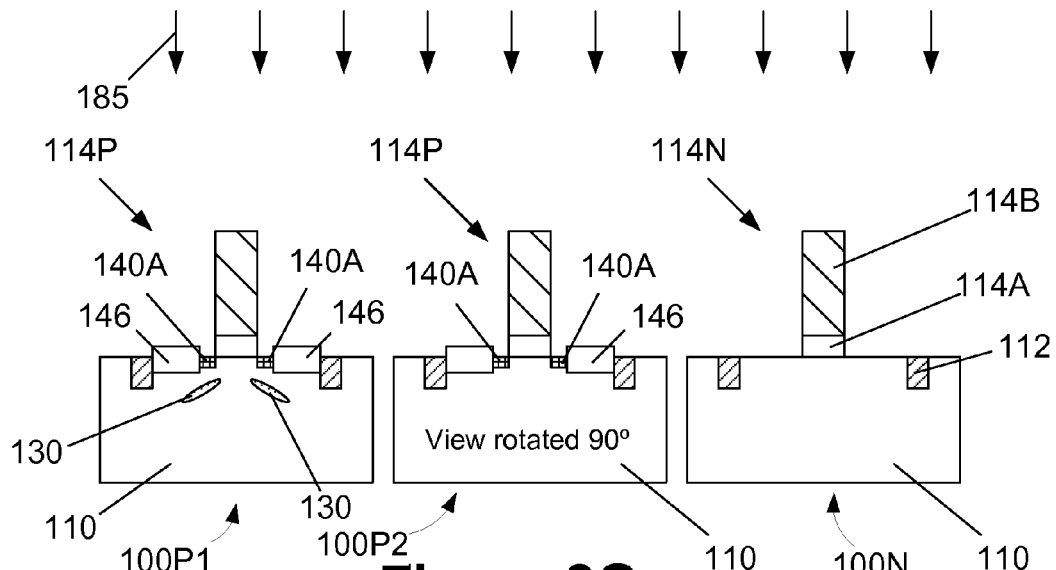
Figure 3R:
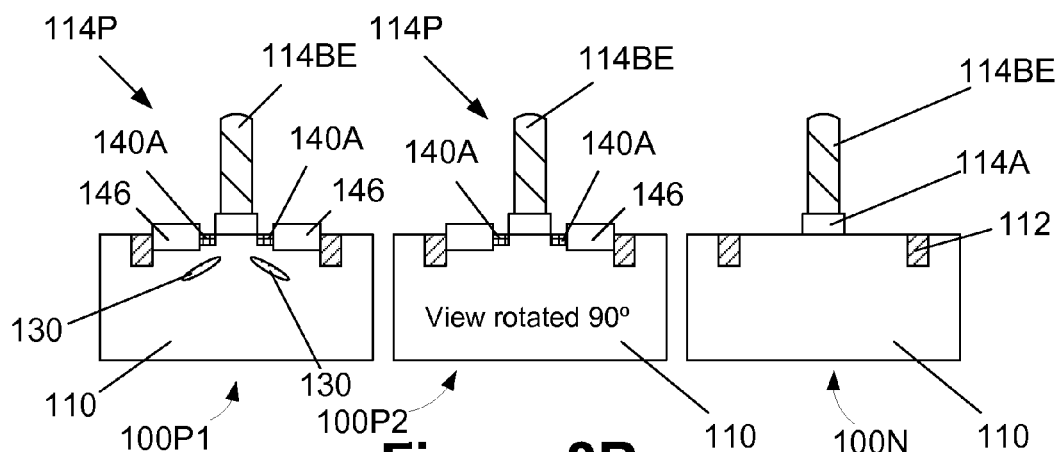
Figure 3S:
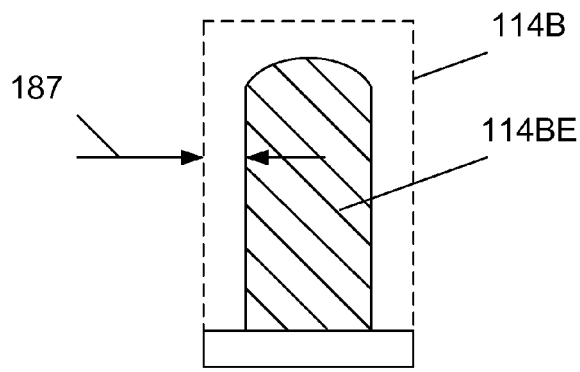

FIGS. 3A-3S depict various illustrative process flows for forming a semiconductor device 100 disclosed herein. FIG. 3A is a schematic plan view of the device 100 that includes an illustrative first PFET transistor 100P1, a second PFET transistor 100P2 and an illustrative NFET transistor 100N. Each of the transistors is formed in an active area of a semiconducting substrate (the overall configuration of which is not shown) defined by an illustrative isolation structure 112. Of course, in a real-world product, there may be millions or thousands of such transistors on the device 100. FIG. 3A depicts the device 100 at a later point in fabrication wherein source/drain regions have been formed on the transistors in an effort to provide some context to the detailed discussion that follows below. In one illustrative embodiment, the first and second PFET transistors 100P1, 100P2 have basically the same configuration except that the long axis of the gate structures of the two devices are oriented approximately normal or transverse to one another. Of course, they may be particular manufacturing details that may be different between the first and second PFET transistors 100P1, 100P2, e.g., gate insulation thicknesses, etc., but in general they will have the same or similar doped regions. The first and second PFET transistors 100P1, 100P2 each comprise a gate structure 114P, a source region 104S and a drain region 104D. In one illustrative embodiment, the long axis 114P1A of the first PFET transistor 100P1 is positioned approximately parallel to a line that would pass through the schematically depicted wafer notch 60, while the long axis 114P2A of the second PFET transistor 100P2 is oriented at approximately 90 degrees relative to the long axis 114P1A of the first PFET transistor 100P1, i.e., the transistors are oriented transverse to one another. In the configuration depicted in FIG. 3A, the first PFET transistor 100P1 may commonly be referred to as a "standard" transistor, while the second PFET transistor 100P2 may commonly be referred to as a "horizontal" transistor. Thus, as commonly used, the labels "standard" and "horizontal" for the transistors 100P1, 100P2 only define a transverse orientation relationship between the first and second PFET transistors 100P1, 100P2. The NFET transistor 100N comprises a gate structure 114N, a source region 102S and a drain region 102D. In the depicted example, the long axis 114NA of the NFET transistor 100N is positioned approximately parallel to the schematically depicted wafer notch 60, and it is positioned approximately parallel to the long axis 114P1A of the first PFET transistor 100P1. Of course, it is not required that the long axis of any of the transistors 100N, 100P1 or 100P2 shown in FIG. 3A be aligned with the wafer notch 60. Additionally, in some embodiments, it may be the case that the long axis 100P2A of the second PFET transistor 100P2 is substantially aligned with the wafer notch 60, while the first PFET transistor 100P1 and the NFET transistor are both positioned transverse to the wafer notch 60. As shown in the cross-sectional figures that follow below, various aspects of the formation of the NFET transistor 100N and the first and second PFET transistors 100P1, 100P2 will be described with it being understood that the fabrication of the second PFET transistor 100P2 will be the same as that of the first PFET transistor 100P1 with the exception of the orientation of the halo implantation processes. More specifically, with continuing reference to FIG. 3A, a tilted halo implantation process 100P1H will be performed on the first PFET transistor 100P1 from a first direction while a tilted halo implantation process 100P2H will be performed on the second PFET transistor 100P2 from a second direction as described more fully below. That is, the tilted halo implantation process 100P1H will be performed in a direction that is transverse to the direction of the tilted halo implantation process 100P2H. Additionally, a tilted halo implantation process 100NH will be performed on the NFET transistor 100N.

FIG. 3B is a cross-sectional view depicting the three transistors 100P1, 100P2 and 100N being formed above separated regions of the semiconducting substrate 110. Of course, given the transverse orientation of the second PFET transistor 100P2 relative to the first PFET transistor 100P1, as shown in FIG. 3A, the cross-sectional view of the second PFET transistor 100P2 has been rotated 90 degrees relative to the cross-sectional views of the first PFET transistor 100P1 and the NFET transistor 100N. The substrate 110 may have a variety of configurations, such as the depicted bulk silicon configuration. The substrate 110 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 110 may also be made of materials other than silicon.

As shown in FIG. 3B, the process begins with the formation of illustrative gate structures 114P for the first and second PFET transistors 100P1, 100P2 and a gate structure 114N for the NFET transistor 100N. The gate structures 114P, 114N are formed above active regions 111 that are defined in the substrate 110 by the illustrative shallow trench isolation structures 112. In one illustrative embodiment, the gate structures 114P, 114N generally each include a gate insulation layer 114A, one or more conductive gate electrode layers 114B and a gate cap layer 116, made of a material such as silicon nitride. In some applications, an illustrative liner layer (not shown) may be conformably deposited on the device 100 at this point in the fabrication process. However, since such a liner layer is not relevant to the presently disclosed inventions, it has not been depicted in the drawings. FIG. 3C is a simplified schematic plan view of the device at this point in the fabrication process showing the formation of the gate structures 114P, 114N above the various active regions 111.

The gate structures 114P, 114N depicted herein are intended to be schematic and representative in nature, as the materials of construction used in the gate structures 114P in the first and second PFET transistors 100P1, 100P2 may be different than the gate structure 114N in the NFET transistor 100N, e.g., the PFET transistors 100P1, 100P2 may have multiple layers of conductive metal, etc. However, in some applications, the gate structures 114P, 114N may be comprised of the same basic materials, e.g., both gate structures 114P and 114N may comprise a silicon dioxide gate insulation layer and a polysilicon gate electrode. In general, the gate insulation layer 114A may be comprised of a variety of materials, such as silicon dioxide, silicon oxynitride, a high-k (k value greater than 10) insulating material. The gate electrode 114B may be comprised of one or more layers of conductive materials, such as polysilicon, a metal, etc. The gate structures 114P, 114N depicted in FIG. 3B may be formed by performing a variety of known techniques. For example, the layers of material that make up the illustrative gate insulation layer 114A, the gate electrode 114B and the gate cap layer 116 may be blanket-deposited above the substrate 110 and, thereafter, one or more etching process are performed through a patterned mask layer (not shown) to define the basic gate structures 114P, 114N depicted in FIG. 3B. Moreover, the gate insulation layers and gate electrodes in the gate structures 114P, 114N may be the final gate insulation layers and gate electrodes to be used on the production device or they may be sacrificial structures that may be later removed and replaced with final gate insulation layers and gate electrodes for the finished device using well-known "gate-last" formation techniques.

In one illustrative embodiment, the next process operation involves the formation of extension implant regions on both of the first and second PFET transistors 100P1, 100P2 and the formation of halo implant regions on one of the first and second PFET transistors 100P1, 100P2. In the depicted example, the halo implant regions are first formed on the first PFET transistor 100P1. However, as will be understood by those skilled in that art after a complete reading of the present application, the halo implant regions could have been formed first on the second PFET transistor 100P2. Moreover, the implant process to form the halo regions on one of the first and second PFET transistors 100P1, 100P2 and the implant process performed to form extension implant regions on both of the first and second PFET transistors 100P1, 100P2 may be performed in any order. In the illustrative example described herein, the halo implantation process is performed prior to the extension implant process, although such an order of implantation steps should not be considered to be a limitation of the presently disclosed inventions.

As shown in FIGS. 3D-3E, the process begins with the formation of a patterned ion implantation mask 120, e.g., a patterned photoresist mask, that covers the NFET transistor 100N and exposes both of the first and second PFET transistors 100P1, 100P2 so that various implantation processes may be performed on the first and second PFET transistors 100P1, 100P2. Initially, a halo implantation process 100P1H is performed on the device 100 to form schematically depicted halo implant regions 130 for the first PFET transistor 100P1, as shown in FIG. 3D. The halo implant regions 130 on the first PFET transistor 100P1 are not depicted in FIG. 3E. Note that, during this halo implantation process, halo implant regions are not formed in the substrate for the second PFET transistor 100P2 due to the fact that the second PFET transistor 100P2 is oriented transverse relative to the orientation of the first PFET transistor 100P1. More specifically, the implant direction employed in the halo implantation process 100P1H is in a direction that is substantially parallel with the gate width direction of the second PFET transistor 100P2 and, accordingly halo implant regions cannot be formed in the desired location for the second PFET transistor 100P2. Of course, as will be appreciated by those skilled in the art, the halo implantation process 100P1H is actually a two-step implantation process, wherein the substrate 110 is rotated 180 degrees after a first part of halo implant process 100P1H is performed to form the halo implant region 130 on a first side, e.g., a source side of the transistor 100P1, and thereafter a second part of the halo implant process 100P1H is performed to form the halo implant region 130 on the other side of the transistor, e.g., on the drain side of the transistor 100P1. The halo implantation process 100P1H may be performed with any species of an N-type dopant, and the dopant dose and implant energy may vary depending upon the particular application. The halo implantation process 100P1H may be performed at a relatively small implant angle 122. e.g., 30 degrees or less (relative to the vertical), to avoid undesirable shadowing by adjacent gate structures (not shown) as discussed in the background section of this application. During the halo implantation process 100P1H, the cap layers 116 are present on the gate structures 114P of the first and second PFET transistors 100P1, 100P2. As it relates to implantation angles discussed and claimed herein, all angles are described relative to a vertical axis.

Next, as shown in FIGS. 3F-3G, an extension ion implantation process 140 is performed to form P-doped extension implant regions 140A in the substrate 110 for both of the first and second PFET transistors 100P1, 100P2. Typically, the extension implant regions 140A will be self-aligned with respect to the sidewall of the gate structure 114P (or there may be an offset spacer or liner (not shown) formed on the sidewall of the gate structure 114P prior to performing the extension implant process 140. The extension implant process 140 is typically vertical in nature (thus, there are no associated arrows in FIG. 3F as they would be pointing downward into the drawing page). The extension implant process 140 may be performed with any species of a P-type dopant, and the dopant dose and implant energy used during the extension implant process 140 may vary depending upon the particular application. Thus, at this point in the fabrication process, extension implant regions 140A have been formed for both the first and second PFET transistors 100P1, 100P2, while halo implant regions 130 have only been formed on the first PFET transistor 100P1. Of course, the NFET transistor 100N has been masked during the various implant processes that were performed on the first and second PFET transistors 100P1, 100P2, as described above.

Next, as shown in FIG. 3H, sidewall spacers 142 are formed proximate the gate structures 114P of both of the first and second PFET transistors 100P1, 100P2. The sidewall spacers 142 are typically formed by conformably depositing a layer of spacer material and thereafter performing an anisotropic etching process.

Thereafter, as shown in FIG. 3I, an etching process is performed to form recesses 144 in the substrate 110 proximate the gate structure 114P of both of the first and second PFET transistors 100P1, 100P2. The depth of the recesses 144 may vary depending upon the particular application. In one illustrative embodiment, an anisotropic etching process is performed to form the recesses 144.

Then, as shown in FIG. 3J, a semiconductor material 146 is formed in the recesses 144 on both of the first and second PFET transistors 100P1, 100P2. In one illustrative embodiment, the semiconductor material 146 may be a silicon/germanium material that may be formed by performing well-known epitaxial deposition processes. The thickness of the semiconductor material may vary depending upon the particular application.

Next, as shown in FIG. 3K, the ion implantation mask 120 is removed by performing, for example, an ashing process. Then, an etching process, such as a wet isotropic etching process, is performed to remove the gate cap layers 116 from above all of the transistors 100N, 100P1 and 100P2 and to remove the sidewall spacers 142 formed on the first and second PFET transistors 100P1, 100P2.

In one illustrative process flow, the next series of process operations performed on the device 100 involves forming halo implant regions, extension implant regions and source/drain implant regions for the NFET transistor 100N while masking both of the first and second PFET transistors 100P1, 100P2. Accordingly, as shown in FIG. 3L, the process begins with the formation of a patterned ion implantation mask 148, e.g., a patterned photoresist mask, that covers both of the first and second PFET transistors 100P1, 100P2 and exposes the NFET transistor 100N so that various implantation processes may be performed on the NFET transistor 100N. Initially, a halo implantation process 100NH is performed on the device 100 to form schematically depicted halo implant regions 150A for the NFET transistor 100N, as shown in FIG. 3L. As noted before, the halo implantation process 100NH is actually a two-step implantation process wherein the substrate 110 is rotated 180 degrees after a first part of the halo implant process 100NH is performed to form the halo implant region 150A on a first side, e.g., a source side of the transistor 100N, and, thereafter, a second part of the halo implant process 100NH is performed to form the halo implant region 150A on the other side of the transistor, e.g., on the drain side of the transistor 100N. The halo implantation process 100NH may be performed with any species of a P-type dopant, and the dopant dose and implant energy may vary depending upon the particular application. The halo implantation process 100NH may be performed at a relatively small implant angle 150, e.g., about 25-35 degrees or less (relative to the vertical) to avoid undesirable shadowing by adjacent gate structures (not shown) as discussed in the background section of this application, although the halo implantation process 100NH may be performed at a higher implant angle than the halo implantation process 100P1H.

Next, as shown in FIG. 3M, an extension ion implantation process 160 is performed to form N-doped extension implant regions 160A in the substrate 110 for the NFET transistor 100N. Typically, the extension implant regions 160A will be self-aligned with respect to the sidewall of the gate structure 114N. The extension implant process 160 is typically a vertical ion implantation process. The extension implant process 160 may be performed with any species of an N-type dopant, and the dopant dose and implant energy used during the extension implant process 160 may vary depending upon the particular application.

Next, as shown in FIG. 3N, sidewall spacers 152 are formed proximate the gate structures 114N of the NFET transistor 100N. The sidewall spacers 152 are typically formed by conformably depositing a layer of spacer material and thereafter performing an anisotropic etching process. With continuing reference to FIG. 3N, after the sidewall spacers 152 are formed, an ion implantation process 170 is performed on the NFET transistor 100N to form so-called deep source/drain implant regions 170A in the substrate 110. The ion implantation process 170 performed to form the deep source/drain implant regions 170A is typically performed using a higher dopant dose and a higher implant energy than the ion implantation process 160 that is performed to form the extension implant regions 160A. The source/drain implant process 170 is typically a vertical ion implantation process. The source/drain implant process 170 may be performed with any species of an N-type dopant, and the dopant dose and implant energy used during the source/drain implant process 170 may vary depending upon the particular application.

Thus, at this point in the fabrication process: (1) extension implant regions 140A have been formed for both the first and second PFET transistors 100P1, 100P2, while halo implant regions 130 have only been formed on the first PFET transistor 100P1; and (2) halo implant regions 150A, extension implant regions 160A and source/drain implant regions 170A have been formed on the NFET transistor 100N. Of course, the first and second PFET transistors 100P1, 100P2 were masked during the various implant processes that were performed on the NFET transistor 100N, as described above.

As shown in FIGS. 3O-3P, the ion implantation masking layer 148 is removed from above the first and second PFET transistors 100P1, 100P2, and another patterned ion implantation mask 172, e.g., a patterned photoresist mask, is formed that covers the NFET transistor 100N and exposes both of the first and second PFET transistors 100P1, 100P2. Thereafter, a halo implantation process 100P2H is performed on the device 100 to form schematically depicted halo implant regions 190A for the second PFET transistor 100P2, as shown in FIG. 3O. Note that, during the halo implantation process 100P2H, additional halo implant regions are not formed in the substrate for the first PFET transistor 100P1 due to the fact that the first PFET transistor 100P1 is oriented transverse relative to the orientation of the second PFET transistor 100P2. More specifically, the implant direction employed in the halo implantation process 100P2H is in a direction that is substantially parallel with the gate width direction of the first PFET transistor 100P1 and, accordingly, halo implant regions cannot be formed in the desired location for the first PFET transistor 100P1. Of course, as noted above, the halo implantation process 100P2H is actually a two-step implantation process wherein the substrate 110 is rotated 180 degrees after a first part of the halo implant process 100P2H is performed. The halo implantation process 100P2H may be performed with any species of an N-type dopant, and the dopant dose and implant energy may vary depending upon the particular application. As can be seen by comparing FIGS. 3E and 3P, the halo implant processes 100P1H, 100P2H are performed in directions that are normal or perpendicular to one another (assuming the substrate stays in a fixed position). The halo implantation process 100P2H may be performed at an implant angle 180 (see FIG. 3O) that is greater than the relatively smaller implant angle 122 (see FIG. 3D) used during the earlier halo implant process 100P1H. The implant angle of the halo implantation process 100P2H may be greater than the implant angle 122 of the halo implant process 100P1H due to the fact that the cap layer 116 has been removed from the first and second PFET transistors 100P1, 100P2 prior to performing the halo implant process 100P2H, which thereby reduces undesirable shadowing by adjacent gate structures (not shown) as discussed in the background section of this application. In one illustrative embodiment, the implant angle 180 of the halo implant process 100P2H may fall within the range of about 30-45 degrees, and, in one particular example, may be about 35 degrees. In one illustrative example, the implant angle 180 of the halo implant process 100P2H is at least about 5 degrees greater than the first tilted implant angle 122 used during the earlier halo implant process 100P1H. In another example, the first tilted implant angle 122 is an angle within the range of about 20-30 degrees and the second tilted implant angle 180 is an angle within the range of about 35-45 degrees.

Thereafter, the ion implant masking layer 172 is removed and a heating or anneal process is performed to form the final source/drain regions (not shown) for the transistors 100P1, 100P2, 100N. This heating process repairs the damage to the lattice structure of the substrate 110 as a result of the various ion implantation processes described above and it activates the implanted dopant materials, i.e., the implanted dopant materials are incorporated into the silicon lattice. The various implantation processes described above may be performed using well-known ion implantation systems.

Another illustrative aspect of forming doped regions on transistor devices will now be further described with reference to FIGS. 3Q-3S. FIG. 3Q depicts the device 100 at the point of fabrication wherein the gate cap layers 116 were removed from the various gate structures 114P, 114N. The removal of the gate cap layers 116 was initially discussed with reference to FIG. 3K. At this point, if desired, a timed isotropic etching process 185 may be performed to reduce the initial size of the gate electrode structures 114B and, in some cases, to round the upper corners of the gate electrode structures 114B. This etching process results in the illustrative etched gate electrode structures 114BE depicted in FIG. 3R. FIG. 3S is an enlarged view of the etched gate electrode structure 114BE superimposed over a dashed outline of the gate electrode 114B before the etching process 185 was performed. In one illustrative embodiment, the etching process 185 may be performed for a duration such that a thickness 187 of about 5-10 nm is removed from the original gate electrode 114B. However, the desired amount of size reduction and/or corner rounding of the original gate electrode 114B may vary depending upon the particular application. Performing the etching process 185 to reduce the size and/or change the shape of the original gate electrode 114B is another way to reduce undesirable shadowing by adjacent gate structures (not shown) as discussed in the background section of this application. If this technique is employed, the reduction in size of the original gate electrode 114B may be taken into account so as to arrive at a final gate electrode having the final desired critical dimension. Additionally, if desired, the etching of the gate electrodes 114B may only be performed on the PFET devices 100P1, 100P2, i.e., the etching process may be performed on only the PFET devices after the ion implant mask 172 is formed above the NFET transistor 100N.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first gate structure for a first transistor device and a second gate structure for a second transistor device above a semiconducting substrate, wherein said first and second gate structures comprise a cap layer and wherein said first and second transistors are oriented transverse to one another;
    performing a first halo ion implant process to form first halo implant regions in said substrate for said first transistor with said cap layer in position in said first gate structure of said first transistor;
    removing said cap layer from both of said first and second gate structures; and
    after removing said cap layer from both of said first and second gate structures, performing a second halo ion implant process to form second halo implant regions in said substrate for said second transistor, wherein said first and second halo implant processes are performed at transverse angles relative to said substrate and wherein both of said first and second transistor devices are unmasked during said second halo ion implant process and fully exposed to said second halo ion implantation process.

2. The method of claim 1, wherein said first and second transistors are PFET transistors.

3. The method of claim 1, wherein said first and second transistors are NFET transistors.

4. The method of claim 1, wherein said first and second gate structures comprise a gate electrode and a gate insulation layer that are sacrificial structures.

5. The method of claim 1, wherein said first and second gate structures comprise a gate electrode and a gate insulation layer that are a final gate electrode and a gate insulation layer of a final integrated circuit product.

6. The method of claim 1, wherein said first and second gate structures are comprised of the same materials.

7. The method of claim 1, wherein said first and second gate structures are comprised of different materials.

8. The method of claim 1, further comprising, after removing said cap layer, performing an etching process to reduce an original size of a gate electrode of said second gate structure and thereafter performing said second halo implant process.

9. The method of claim 1, wherein said first halo implant process is performed at a first tilt angle and said second halo implant process is performed at a second tilt angle, wherein said second tilt angle is greater than said first tilt angle.

10. The method of claim 9, wherein said second tilt angle is at least 5 degrees greater than said first tilt angle.

11. The method of claim 9, wherein said first tilt angle is an angle within the range of about 20-30 degrees and said second tilt angle is an angle within the range of about 35-45 degrees.

12. A method, comprising:
    forming a first gate structure for a first PFET transistor device and a second gate structure for a second PFET transistor device above a semiconducting substrate, wherein said first and second gate structures comprise a cap layer and wherein said first and second PFET transistors are oriented transverse to one another;
    forming a third gate structure for an NFET transistor above said semiconducting substrate, wherein said third gate structure comprises a cap layer;
    performing a first halo ion implant process at a first tilt angle to form first halo implant regions in said substrate for said first PFET transistor with said cap layer in position in said first gate structure of said first PFET transistor;
    removing said cap layer from said first gate structure of said first PFET transistor and from said second gate structure of said second PFET transistor; and
    after removing said cap layer from said first gate structure of said first PFET transistor and from said second gate structure of said second PFET transistor, performing a second halo ion implant process at a second tilt angle to form second halo implant regions in said substrate for said second PFET transistor, wherein said first and second halo implant processes are performed at transverse angles relative to said substrate, wherein said second tilt angle is greater than said first tilt angle and wherein and wherein both of said first and second PFET transistor devices are unmasked during said second halo ion implant process and fully exposed to said second halo ion implantation process.

13. The method of claim 12, wherein said second tilt angle is at least 5 degrees greater than said first tilt angle.

14. The method of claim 12, wherein said first tilt angle is an angle within the range of about 20-30 degrees and said second tilt angle is an angle within the range of about 35-45 degrees.

15. The method of claim 12 further comprising:
    after removing said cap layer from said second gate structure, masking said first and second PFET transistors; and
    performing a plurality of ion implantation processes to form halo implant regions, extension implant regions and source/drain implant regions in said substrate for said NFET transistor.

16. The method of claim 15, wherein said step of performing said second halo implant process is performed after said halo implant regions, extension implant regions and source/drain implant regions are formed in said substrate for said NFET transistor.

17. The method of claim 12, further comprising, after removing said cap layer from said second gate structure, performing an etching process to reduce an original size of a gate electrode of said second gate structure and thereafter performing said second halo implant process.

18. A method, comprising:
  forming a first gate structure for a first PFET transistor device and a second gate structure for a second PFET transistor device above a semiconducting substrate, wherein said first and second gate structures comprise a cap layer and wherein said first and second PFET transistors are oriented transverse to one another;
  forming a third gate structure for an NFET transistor above said semiconducting substrate, wherein said third gate structure comprises a cap layer;
  performing a first halo ion implant process at a first tilt angle to form first halo implant regions in said substrate for said first PFET transistor with said cap layer in position in said first gate structure of said first PFET transistor;
  removing said cap layer from said first, second and third gate structures;
  performing a plurality of ion implantation processes to form halo implant regions, extension implant regions and source/drain implant regions in said substrate for said NFET transistor, and
  after forming said halo implant regions, extension implant regions and source/drain implant regions for said NFET transistor, performing a second halo ion implant process at a second tilt angle to form second halo implant regions in said substrate for said second PFET transistor, wherein said first and second halo implant processes are performed at transverse angles relative to said substrate, and wherein said second tilt angle is greater than said first tilt angle.

19. The method of claim 18, further comprising, after removing said cap layer from said first, second and third gate structures, performing an etching process to reduce an original size of a gate electrode of at least said second gate structure and thereafter performing said second halo implant process.

20. The method of claim 18, wherein said second tilt angle is at least 5 degrees greater than said first tilt angle.

21. The method of claim 18, wherein said first tilt angle is an angle within the range of about 20-30 degrees and said second tilt angle is an angle within the range of about 35-45 degrees.

22. A method, comprising:
  forming a first gate structure for a first transistor device and a second gate structure for a second transistor device above a semiconducting substrate, wherein said first and second gate structures comprise a cap layer and wherein said first and second transistors are oriented transverse to one another;
  performing a first halo ion implant process to form first halo implant regions in said substrate for said first transistor with said cap layer in position in said first gate structure of said first transistor;
  removing said cap layer from at least said second gate structure of said second transistor;
  after removing said cap layer, performing an etching process to reduce an original size of a gate electrode of said second gate structure; and
  after performing said etching process, performing a second halo ion implant process to form second halo implant regions in said substrate for said second transistor, wherein said first and second halo implant processes are performed at transverse angles relative to said substrate.

23. A method, comprising:
  forming a first gate structure for a first PFET transistor device and a second gate structure for a second PFET transistor device above a semiconducting substrate, wherein said first and second gate structures comprise a cap layer and wherein said first and second PFET transistors are oriented transverse to one another;
  forming a third gate structure for an NFET transistor above said semiconducting substrate, wherein said third gate structure comprises a cap layer;
  performing a first halo ion implant process at a first tilt angle to form first halo implant regions in said substrate for said first PFET transistor with said cap layer in position in said first gate structure of said first PFET transistor;
  removing said cap layer from said second gate structure of said second PFET transistor;
  after removing said cap layer from said second gate structure of said second PFET transistor, performing an etching process to reduce an original size of a gate electrode of said second gate structure;
  after performing said etching process, performing a second halo ion implant process at a second tilt angle to form second halo implant regions in said substrate for said second PFET transistor, wherein said first and second halo implant processes are performed at transverse angles relative to said substrate, and wherein said second tilt angle is greater than said first tilt angle.

* * * * *